United States Patent [19]
Ricard et al.

[11] Patent Number: 4,495,155
[45] Date of Patent: Jan. 22, 1985

[54] MODIFIED CRUCIBLE FOR THE PENDANT DROP METHOD OF CRYSTALLIZATION

[75] Inventors: Jean Ricard, Grenoble; Charles Excoffon, Les Peillets, both of France

[73] Assignee: Circeram, Paris, France

[21] Appl. No.: 496,893

[22] Filed: May 23, 1983

[30] Foreign Application Priority Data

Jun. 11, 1982 [FR] France ............... 82 10174

[51] Int. Cl.$^3$ .................. C30B 15/08; C30B 15/10
[52] U.S. Cl. .................. 422/248; 156/DIG. 83; 156/DIG. 96; 156/615; 219/421; 432/263
[58] Field of Search ............ 422/246, 248, 249, 247; 156/617 V, 608, 615, DIG. 83, DIG. 96; 164/335; 432/262, 263; 219/421, 521; 373/155-157

[56] References Cited

U.S. PATENT DOCUMENTS 1,837,070 12/1931 Roth .................. 219/421
3,598,282 8/1971 Phillips .................. 219/421
4,394,006 7/1983 Bedell .................. 164/335

FOREIGN PATENT DOCUMENTS 2321326 3/1977 France.
2359639 2/1978 France.
2376697 8/1978 France.
2401696 3/1979 France.

Primary Examiner—Hiram H. Bernstein
Assistant Examiner—John Donofrio
Attorney, Agent, or Firm—Oblon, Fisher, Spivak, McClelland & Maier

[57] ABSTRACT

A crucible useful for continuous preparation of single crystals with selected crystal orientation or for depositing thin films of crystalline materials such as silica on substrates such as graphite by the pendant drop growth (PDG) method, the crucible base being tapped with one or more capillary bores having a length equal to or greater than the retention height of the molten liquid used to prepare the crystal of film at the temperatures and pressures used, the crucible being improved by "capping" its bottom with a conical baffle plate supported by feet on the bottom of the crucible, the improved crucible providing single crystals having high dimensional regularity and containing no bubbles or unmelted inclusions and the single crystals being broadly useful in jewelry, horology, and electronics.

4 Claims, 1 Drawing Figure

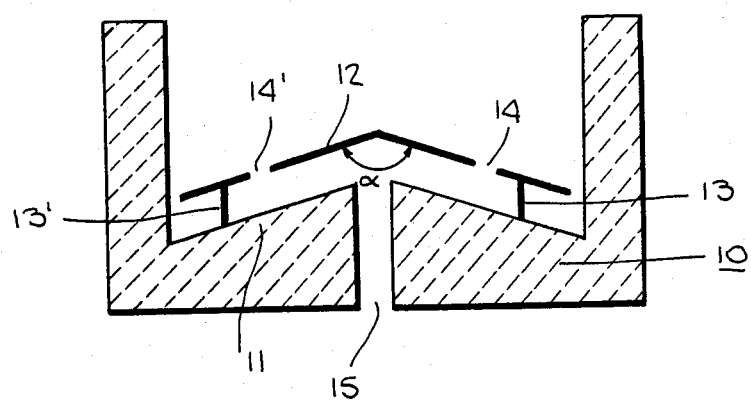

MODIFIED CRUCIBLE FOR THE PENDANT DROP METHOD OF CRYSTALLIZATION

BACKGROUND OF THE INVENTION

The present invention relates to a crucible for use in the pendant drop crystal growth method for preparing single crystals, and more particularly, it involves improvements in the crucibles heretofore used for such methods.

Crucibles for use in the pendant drop growth (PDG) method for preparing single crystals have been described in French Pat. Nos. 2,321,326; 2,359,639, and 2,376,697. These crucibles have been utilized particularly for the preparation of single crystals in the form of fibers or plaques (see French Pat. No. 2,321,326), for the preparation of single crystals in the form of tubes (see French Pat. No. 2,359,639) and for the deposition of thin films of crystalline silicon on graphite substrates (see French Pat. No. 2,401,696).

In the crystallization procedure called the pendant drop growth method, also known as the PDG method, there is utilized a crucible having in its lower region a capillary bore. The crucible fulfills two functions: First, it serves to melt the material (the powder or crushed crystal) to be crystallized by an appropriate heating means, such as by a resistive heater or by direct induction heating in the crucible; second, by virtue of the capillary bore provided in the lower region, the crucible gives to the liquid initially passing therethrough the form of a drop at the lower edge of the capillary, the drop then hanging at that lower edge.

When this capillary channel is filled and the drop has formed, a seed is advanced to the molten drop at the lower end of the capillary and is touched to the drop. There is thus established a liquid-solid interface. Commencing at that time, the seed is drawn downwardly away and provides for the growth of a crystal, the liquid-solid interface being maintained at a suitable level through the use of an appropriate temperature gradient. At the same time, powder or crushed crystal is fed to the upper part of the crucible, where the melting of the feed material is carried out.

Under these conditions of making single crystals by the pendant drop growth method, it has been found that numerous phenomena can lead to defects in the single crystal so pulled.

(a) The capillary orifice situated in the base of the crucible is a rather narrow mouth through which the liquid is constrained to pass. This opening for the liquid, which experimentally comprises a thin layer of 0.5 to 1 mm or more at the bottom of the crucible, causes irregular liquid flow both across the length of the orifice and in the manner of entering the orifice.

In effect, the feed powder falls down chiefly at the center of the crucible and it melts in place. The liquid obtained entirely fills the bottom of the crucible. Nevertheless, the center of the crucible is better fed with still unmelted powder than the outer portions, which results in the central part of the orifice being filled in a more regular fashion than the edges. Some temperature differences between the center and the edges of the crucible have an effect on the viscosity and the surface tension of the liquid, which also causes some local differences in the ability of the liquid to enter the capillary orifice.

(b) On the other hand, the capillary orifice possesses a sharp ridged edge, which produces turbulent flow of the liquid at that spot, causing zones of expansion-compression in the interior of the channel. Since the process operates above or very close to the melting point of the liquid, this provokes cavitation phenomena, that is, local vaporization of the liquid, and thereby causes bubbles in the liquid in the interior of the capillary channel. These bubbles can be detected in the crystal where they create voids of various forms, such as elongated, cylindrical, or spherical.

The phenomena described above also disturb the temperature equilibrium below the capillary channel at the level of the liquid-solid growth interface, and this tends to cause various defects, such as unmelted beads and dislocations in the crystal.

Moreover, this thin film of liquid is cooled by radiation toward the top of the crucible. To the extent that the liquid layer does not have exactly the same thickness over the entire bottom of the crucible, this acts to increase temperature differences across the liquid which enters the entire width of the capillary opening.

Additionally, the quantity of liquid present in the channel of the crucible is small, on the order of 0.5 cm$^3$ for a crucible serving to pull sapphire ribbons 30 mm across and 0.8 mm thick. Thus, if the amount of powder fed varies, this quantity of liquid varies and equally the feed to the channel varies, which may cause variations of crystal thickness.

THE INVENTION

The present invention serves to alleviate the difficulties described above, and it also improves the quality of the single crystals obtained. According to the present invention, the crucible for preparing single crystals by the pendant drop growth method is provided with a conical baffle plate supported by a number of feet resting on the bottom of the crucible, which is thus "capped".

The present invention accordingly provides an improved crucible for the preparation of single crystals by the pendant drop growth method, which crucible comprises in its lower portion one or several capillary channels having a height greater than or equal to the retention height in the capillary of the melted material used to prepare the single crystal at the temperature and pressure considered, characterized in that the bottom of the crucible is capped by a conical baffle plate supported by several feet resting on the bottom of the crucible.

The invention will be further described with reference to the accompanying Figure, which illustrates a cross-sectional view of one preferred embodiment.

According to one preferred embodiment of the invention, the conical baffle is tapped in its upper part with from 2 to 10 holes having a diameter of from 1 to 3 mm. The material comprising the conical baffle according to the present invention is the same as the material comprising the crucible or any other appropriate material, that is to say, a material inert to the single crystal-forming material at the working temperature. For example, iridium or molybdenum can be used in certain desirable embodiments.

The angle of the baffle cone can be the same as that of the bottom of the crucible or different. If the angle $\alpha$ of the cone at the bottom of the crucible is increased to 180° with respect to the apparatus, the angle of the baffle cone can be varied in the same fashion or can be different. For example, a crucible with a flat bottom, that is, $\alpha = 180°$, can be capped by a baffle cone having an angle less than 180°. The baffle's diameter is, as apparent, less than the interior diameter of the crucible. Its thickness is desirably from about 1 to about 5 mm. The height of the feet supporting the baffle is desirably from about 2 to about 10 mm.

The invention will further be described by reference to the annexed Figure representing a transverse cross-section of the crucible provided with an internal conical baffle plate according to the invention.

The crucible 10, comprising in its lower part a capillary orifice 15, is fitted with internal conical baffle plate 12 supported on the bottom 11 by means of feet 13 and 13'. The upper portion of the baffle is optionally tapped with holes 14 and 14'.

The improvements conferred to the preparation of single crystals by the pendant drop growth method in which a crucible is utilized containing an internal conical baffle according to the present invention are numerous. Some of the more outstanding advantages are a longer transit time of the liquid through the interior of the crucible, which improves the melting of the beads or of the powder fed to the crucible, and the removal of gases or volatile materials contained in the liquid.

A superior temperature homogeneity across the entire bottom of the crucible, and thus at the orifice of the capillary conduit, also is obtained. Further, radiation from the base of the crucible is reduced, and this improves the melting of the beads or of the powder fed to the crucible. Moreover, this obviates the feed material's falling directly to the orifice at the top of the capillary bore. The removal of volatile materials or of gases is assisted by the holes tapped in the conical baffle plate. This construction further avoids the turbulence phenomena and controls the quantity of liquid which enters the conduit.

Among the numerous advantages which result from this are those related to the quality of the crystal and the dimensions of the crystals produced. Thus, there is a decrease in the number of bubbles or voids and in their size. Any remaining bubbles have in totality dimensions less than or equal to 10 microns. The number of bubbles of from 0.1 to 1 mm are diminished by a factor of 1000 or even completely disappear. In the case of sapphire, for example, there are no bubbles apparent by visual inspection.

Additionally, the dimensional regularity of the single crystals obtained is greater. The excellent regularity of the surface of the single crystals obtained and the absence of contamination by the crucible's material of construction are also notable, as is the possibility of using as a feed material alumina fines having a high specific surface, on the order of 6 to 100 m$^2$/g, instead of the more expensive crushed crystallized sapphire. These fine aluminas contain a large amount of adsorbed gas, but use of the presently improved invention provides sapphire ribbons without bubbles.

Unless otherwise indicated herein, all parts, percentages, proportions and ratios are by weight.

The following Example is given to illustrate embodiments of the invention as it is presently preferred to practice it. It will be understood that this Example is illustrative, and the invention is not to be considered as restricted thereto except as indicated in the appended Claims.

EXAMPLE I

Preparation of Single Crystals of Sapphire ($\alpha$-Alumina)

A molybdenum crucible having a total volume of 20 cm$^3$ is tapped in its lower part with a capillary conduit having a rectangular cross-section of 1 by 15 mm. This crucible has an outside diameter of 50 mm and an inside diameter of 30 mm. Its base is gently conical with a cone angle of 150°. In the interior of the crucible, a conical baffle in the form of a Chinese hat rests on feet supported on the bottom of the crucible. The cone angle of this baffle plate is 150°. The feet have a height of 2 mm. The diameter of the baffle is 28 mm, so that there is an annular free space of 1 mm between the internal walls of the crucible and this conical baffle.

The crucible is fed with pieces of crushed Verneuil sapphire having a grain size of from 0.2 to 0.5 mm, and the crucible is brought to a temperature of from 2070° to 2200° C. (the melting point of the $\alpha$-alumina being 2050° C.) through the use of a high frequency generator fed to an induction coil operating at 30 kHz and developing a continuous power of 25 KW.

The crushed Verneuil sapphire melts, filling the space situated between the conical plate and the bottom of the crucible, and then the capillary channel, and forms a drop which hangs from the lower part of the capillary. A thin layer of melted alumina with a thickness of 0.1 mm also forms at the surface of the conical plate. The quantity of liquid alumina present in the crucible and in the capillary conduit is on the order of about 2 cm$^3$.

Once the drop forms at the lower end of the capillary conduit, there is placed in contact with it a thin sapphire single crystal plaque in the selected orientation, with dimensions of 1 by 15 mm which serves as a seed and, once the drop is sticking to the seed, pulling of the seed toward the bottom is commenced at a speed of 30 cm/hr. At the same time, the crucible is fed with alumina at the mean speed of 18 g/hr.

After 20 minutes of pulling, there is obtained a thin sapphire plate having a rectangular section of 1 by 15 mm and about 100 mm in length with a relatively plane surface. Examination by X-ray diffraction shows that the plate is monocrystalline and it has preserved the crystallographic orientation of the seed. By optical examination, the plate so produced possesses the absorption spectrum of sapphire. Visual examination does not show any bubbles nor a poorly melted section. The crystal obtained is totally transparent.

What is claimed is:

1. A crucible for use in the continuous preparation of single crystals having a desired crystal orientation or for depositing crystalline material in a thin film on a substrate by the pendant drop growth method and comprising in its lower region one or more capillary bores having a height equal to or greater than the retention height in the capillary of the molten material used to produce the single crystals or thin film at a temperature and pressure desired, characterized in that the bottom of the crucible is capped by a baffle plate supported on feet resting on the bottom of the crucible, the baffle plate not extending to the inside edges of the crucible.

2. A crucible according to claim 1 wherein the baffle is tapped in its upper part with from 2 to 10 holes having a diameter of from 1 to about 3 mm.

3. A crucible according to claim 1 wherein the baffle plate is conical.

4. A crucible according to claim 1 wherein the cone angle of the baffle plate is equal to the angle of the bottom of the crucible so that the plate and crucible bottom are substantially parallel.

* * * * *